United States Patent
Chou

(10) Patent No.: US 9,824,257 B2
(45) Date of Patent: Nov. 21, 2017

(54) ALL-FLAT SENSOR WITH EXPOSED COLORFUL MEMBER AND ELECTRONIC DEVICE USING SUCH SENSOR

(71) Applicant: J-METRICS TECHNOLOGY CO., LTD., Taipei (TW)

(72) Inventor: Bruce C. S. Chou, Hsin Chu (TW)

(73) Assignee: J-Metrics Technology Co., Ltd., Taipei (TW)

(*) Notice: Subject to any disclaimer, the term of this patent is extended or adjusted under 35 U.S.C. 154(b) by 329 days.

(21) Appl. No.: 14/642,466

(22) Filed: Mar. 9, 2015

(65) Prior Publication Data

US 2015/0269407 A1 Sep. 24, 2015

(30) Foreign Application Priority Data

Mar. 18, 2014 (TW) .............................. 103110039 A

(51) Int. Cl.
G06K 9/00 (2006.01)
H05K 3/28 (2006.01)
H05K 1/14 (2006.01)

(52) U.S. Cl.
CPC .............................. *G06K 9/00053* (2013.01)

(58) Field of Classification Search
CPC ...... H05K 3/284; H05K 3/3447; H05K 1/141; H05K 3/3452
USPC .......................................................... 361/748
See application file for complete search history.

(56) References Cited

U.S. PATENT DOCUMENTS

| | | | |
|---|---|---|---|
| 6,759,264 B2 | 7/2004 | Chou et al. | |
| 7,099,497 B2 | 8/2006 | Chou et al. | |
| 7,277,563 B2 | 10/2007 | Chou | |
| 8,717,775 B1 † | 5/2014 | Bolognia | |
| 2004/0046574 A1 | 3/2004 | Chou | |
| 2004/0208345 A1 | 10/2004 | Chou et al. | |
| 2005/0110103 A1* | 5/2005 | Setlak | G06K 9/0002 257/414 |
| 2014/0103941 A1 | 4/2014 | Chou et al. | |
| 2015/0062709 A1* | 3/2015 | Matsuyuki | C03C 17/3417 359/584 |

FOREIGN PATENT DOCUMENTS

| | | |
|---|---|---|
| TW | 541503 B | 7/2003 |
| TW | I431537 B | 3/2014 |

* cited by examiner
† cited by third party

*Primary Examiner* — Jenny L Wagner
*Assistant Examiner* — Michael P McFadden
(74) *Attorney, Agent, or Firm* — Muncy, Geissler, Olds & Lowe, P.C.

(57) ABSTRACT

An all-flat sensor includes a coupling substrate; a sensing chip, which is disposed on the coupling substrate, has first electrodes arranged in an array and a first dielectric layer covering over the first electrodes, and is electrically connected to the coupling substrate; and a second dielectric layer covering over the sensing chip and providing an outlook color. An electronic device using the all-flat sensor is also provided.

20 Claims, 7 Drawing Sheets

ALL-FLAT SENSOR WITH EXPOSED COLORFUL MEMBER AND ELECTRONIC DEVICE USING SUCH SENSOR

This application claims priority of No. 103110039 filed in Taiwan R.O.C. on Mar. 18, 2014 under 35 USC 119, the entire content of which is hereby incorporated by reference.

BACKGROUND OF THE INVENTION

Field of the Invention

The invention relates to a sensor and an electronic device using such sensor, and more particularly to an all-flat sensor having an exposed colorful member and an electronic device using such sensor.

Related Art

The electronic device with the biometrics message sensor (e.g., a fingerprint sensor) can provide the fingerprint recognition function, and provide the more robust identification authentication method than the password protection for the data confidentiality. Thus, in the market, the huge business opportunity is provided. More particularly, the future mobile device/intelligent mobile phone gradually represents the personal consumer platform, and the mobile payment, such as near-field communication (NFC), constructed in the device also becomes the development trend.

In order to make the commercial financial behavior, constructed in the mobile device, become more secure, the identification authentication mechanism is unavoidable, and the best method is the biometrics identification technique. Based on the stability and uniqueness of the identification characteristic and due to the slim and light requirement of the biometrics message sensor (because the sensor needs to be integrated into the mobile device), the fingerprint sensor technology becomes the rare and optimum technology.

When the fingerprint sensor is mounted on the mobile device, the exposed fingerprint sensor will damage the outlook of the mobile device so that the user cannot accept the mobile device.

FIG. 1 is a schematic view showing a conventional fingerprint sensor 300. Referring to FIG. 1, the fingerprint sensor 300 comprises a package substrate 310, a fingerprint sensing chip 320, wires 330 and a molding compound layer 340. The fingerprint sensing chip 320 is disposed on the package substrate 310, the wires 330 electrically connect the connection pads 312 of the package substrate 310 to the connection pads 322 of the fingerprint sensing chip 320 by way of wire bonding, and the molding compound layer 340 fixes the fingerprint sensing chip 320, the package substrate 310 and the wires 330 together to form an integral product. When such conventional fingerprint sensor 300 is mounted on the housing of the electronic device, the sensor needs to be exposed to contact with the finger and sense the fingerprint. The non-planar design makes the electronic device be formed with a slot or depression for the placement of the sensor, thereby damaging the outlook design. In addition, the user cannot easily touch the sensor due to the design of the slot, thereby decreasing the sensitivity in use. Meanwhile, the outlook colors of the molding compound layer 340 and the fingerprint sensing chip 320 cannot match with the color of the housing of the electronic device, thereby causing the problem of damaging the outlook of the electronic device.

SUMMARY OF THE INVENTION

It is therefore an object of the invention to provide an all-flat fingerprint sensor having an exposed colorful member, and an electronic device using such sensor. The exposed colorful member can provide the outlook color matching with the outlook color of the outlook color of the electronic device to keep the overall outlook and beauty of the electronic device.

To achieve the above-identified object, the invention provides an all-flat fingerprint sensor comprising a coupling substrate; a sensing chip, which is disposed on the coupling substrate, has first electrodes arranged in an array and a first dielectric layer covering over the first electrodes, and is electrically connected to the coupling substrate; and a second dielectric layer covering over the sensing chip and providing an outlook color.

The invention further provides an all-flat fingerprint sensor comprising a sensing module having first electrodes arranged in an array, and a first dielectric layer covering over the first electrodes; and a second dielectric layer covering over the sensing module and providing an outlook color.

The invention also provides an electronic device comprising: a body; a central processing unit (CPU) disposed in the body; a display disposed on the body and electrically connected to the CPU; and the above-mentioned all-flat sensor. The all-flat sensor is disposed on the body, so that an upper surface of the all-flat sensor and an upper surface of the body are located on the same plane. The second dielectric layer of the all-flat sensor and the body have the same color.

The invention also provides an electronic device comprising: a body; a central processing unit (CPU) disposed in the body; a display disposed on the body and electrically connected to the CPU; and the above-mentioned all-flat sensor. The all-flat sensor is disposed on the body, so that an upper surface of the all-flat sensor and an upper surface of the body are located on the same plane. The second dielectric layer of the all-flat sensor and a colorful member of the body have the same color.

With the aspects of the invention, the outlook colors of the electronic device and the sensor can be matched, and it is also possible to achieve the effect of glorifying the outlook without decreasing the sensitivity.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

DETAILED DESCRIPTION OF THE INVENTION

The present invention will be apparent from the following detailed description, which proceeds with reference to the accompanying drawings, wherein the same references relate to the same elements.

This embodiment firstly provides a planar sensor, which is to be disposed on an electronic device and provides a sensing surface that can be easily contacted. Then, a colorful member is applied or coated to a semiconductor sensing chip (more specifically a semiconductor fingerprint sensing chip). Such design is not found in the conventional semiconductor chip device because an ordinary chip is packaged by a package layer for protection and then mounted in a casing. So, the user cannot see the chip device, and it is unnecessary to color the chip device to match with the casing. The semiconductor fingerprint sensing chip is different from the chip device because a finally exposed surface has to be provided to contact the finger and thus to read the fingerprint of the finger, or otherwise the sensing effect cannot be obtained. The fingerprint sensing chip of the invention is further different from the conventional capacitive touch panel/screen, and comprises the higher resolution, wherein the fingerprint chip has the resolution at least higher than 300 dpi, and the resolution of the touch screen is lower than 10 dpi. Upon fingerprint sensing, the fingerprint sensing is performed by directly placing the finger on the chip. Upon touching, the touch chip is disposed inside the electronic device and is not in direct contact with the finger but contacts the finger indirectly through the touch panel/touch screen. Thus, the sensing chip surface coating technology of the invention is not applicable to the similar chip touch technology.

Figure 1:
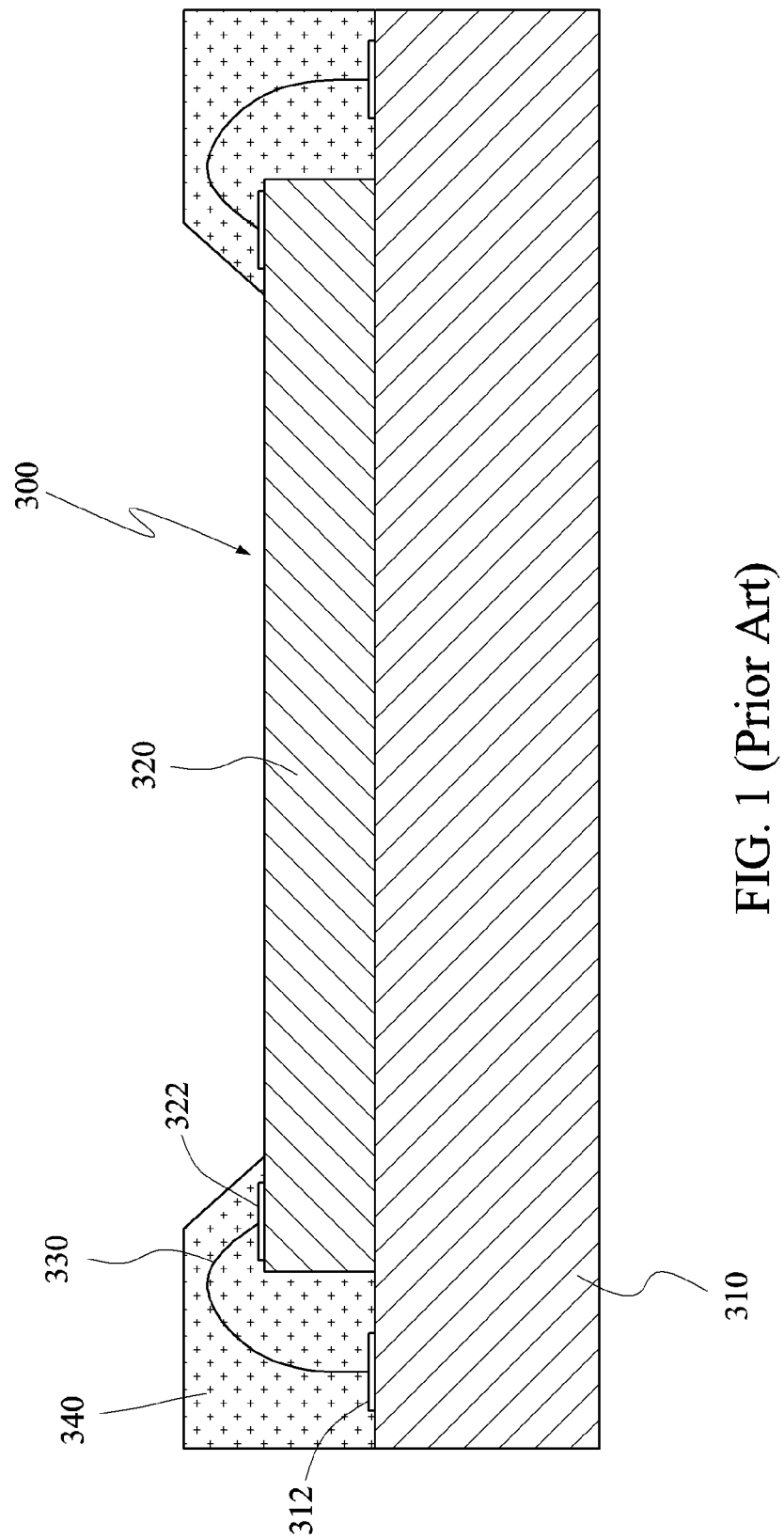
FIG. 1 is a schematic view showing a conventional fingerprint sensor.
Figure 2:
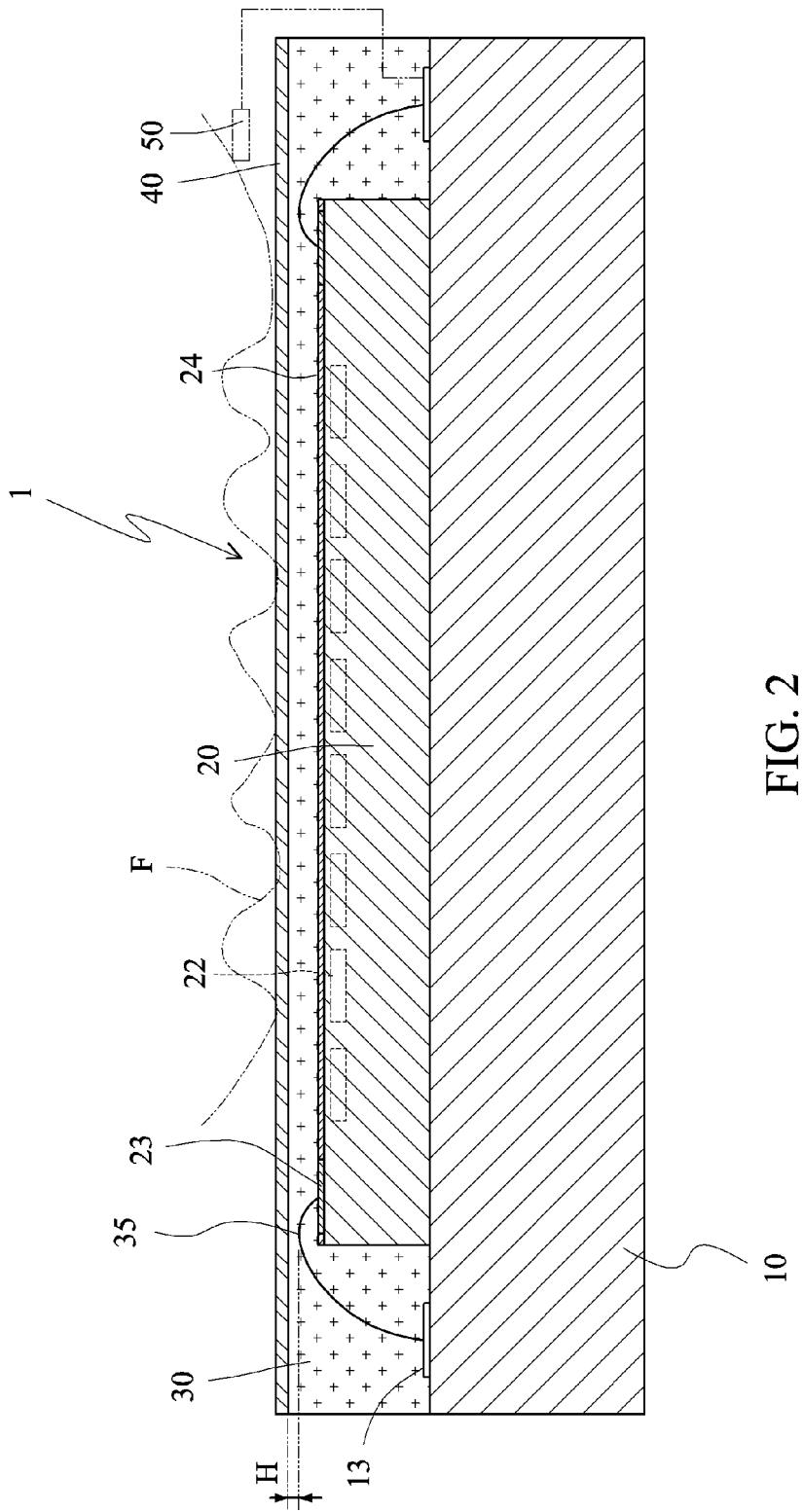
FIG. 2 is a schematic view showing a sensor according to a first embodiment of the invention.

FIG. 2 is a schematic view showing a sensor 1 according to a first embodiment of the invention. Referring to FIG. 2, the all-flat sensor 1 of this embodiment comprises a coupling substrate 10, a sensing chip 20, a molding compound layer (or referred to as a third dielectric layer) 30 and a colorful member (or referred to as a second dielectric layer) 40.

The sensing chip 20 is disposed on the coupling substrate 10, and has sensing member electrodes 22 arranged in an array, and a protection layer (or referred to as a first dielectric layer) 24 covering over the sensing member electrodes 22. The sensing chip 20 is electrically connected to the coupling substrate 10. The coupling substrate 10 also has bonding pads 13 for signal inputting and outputting. The bonding pads 13 are electrically connected to bonding pads 23 through wires 35. In this embodiment, the sensing chip 20 may adopt the capacitive or electric field sensing principle, which may be referred to the following patent applications of the inventor: (a) U.S. patent application Ser. No. 10/403, 052, filed on Apr. 1, 2003, entitled "CAPACITIVE FINGERPRINT SENSOR", and issued on Aug. 29, 2006 as U.S. Pat. No. 7,099,497; (b) U.S. patent application Ser. No. 10/434,833, filed on May 13, 2003, entitled "PRESSURE TYPE FINGERPRINT SENSOR FABRICATION METHOD", and issued on Jul. 6, 2004 as U.S. Pat. No. 6,759,264; (c) 4. U.S. patent application Ser. No. 10/638,371 (US20040046574A1), filed on Aug. 12, 2003, and entitled "CAPACITIVE MICRO PRESSURE SENSING MEMBER AND FINGERPRINT SENSOR USING THE SAME", and issued on Oct. 2, 2007 as U.S. Pat. No. 7,277,563; (d) Taiwan Patent Application No. 090112023, filed on May 17, 2001, and entitled "CAPACITIVE PRESSURE MICROSENSOR AND METHOD FOR MANUFACTURING THE SAME AND DETECTING SIGNALS OF THE SAME", now published as TW541503 and issued as Invention Patent Number 182652; (e) Taiwan Patent Application No. 100106805, filed on Mar. 2, 2011, and entitled "ACTIVE BIO-FEATURES SENSING DEVICE AND ELECTRONIC APPARATUS USING THE SAME", now issued as Invention Patent Number 431537; and (f) U.S. patent application Ser. No. 14/045,514 filed on Oct. 3, 2013, and entitled "CAPACITIVE SENSING ARRAY DEVICE WITH HIGH SENSITIVITY AND ELECTRONIC APPARATUS USING THE SAME", now published as US20140103941A1. In other embodiments, the sensing chip 20 may also adopt thermal sensing or other principles, which may be referred to the following patent applications of the inventor: U.S. patent application Ser. No. 10/414,214 (US20040208345A1), filed on Apr. 16, 2003, and entitled "THERMOELECTRIC SENSOR FOR FINGERPRINT THERMAL IMAGING". The fingerprint sensing chip in this embodiment has the resolution at least higher than 300 dpi. It is worth noting that the key issue of the invention is the creation of the structure over the sensing member electrodes 22 of the sensing chip. Based on the prior art, the coupling substrate 10 on the bottom of the chip may be an organic substrate (e.g., LGA) for wire package, as well as any ceramic or flexible circuit board, or even a silicon interposer formed by the silicon material, or the silicon material with the associated integrated circuit elements (i.e., the sensing chip is wire connected to another integrated circuit chip or wafer). Meanwhile, the invention is not restricted to the utilization of wire connection between the sensing chip and the coupling substrate, and the sensing chip may be electrically connected to the coupling substrate through TSV or other 3D package methods without the use of wires. This embodiment only utilizes the wire packaging to teach those skilled in the art to implement the important structure of the invention.

The molding compound layer 30 covers over the sensing chip 20 and the coupling substrate 10 to fix the sensing chip 20 and the coupling substrate 10 together, the molding compound layer of this embodiment needs to provide the protection (e.g., the protection from the moisture/electrostatic charge or the like) for a sensing chip, and is totally different from other semiconductor chips in that the outermost surface of the molding compound layer in this embodiment further has to provide a surface to directly or indirectly contact the finger direct, so that an electric field/capacitance is formed between the sensing member electrodes 22, wherein the finger is the second electrode, and each sensing member electrode is the first electrode. The molding compound itself has become the third dielectric layer of the sense capacitor between the first and second electrodes. Such definition and the definition and specification to the molding compound layer are also not found in the prior art. Thus, the though of an ordinary package technology and material cannot achieve the technical characteristics and result of the invention. The first dielectric layer is the protection layer 24 above the first electrode. In one embodiment, the first dielectric layer is formed by the semiconductor wafer manufacturing process. For example, each first electrode 22 is the topmost metal in the semiconductor manufacturing process, and the first dielectric layer 24 is the last protection layer of the semiconductor wafer manufacturing process, and is usually the combination of silicon dioxide and silicon nitride. Of course, the invention is not restricted thereto. In short, the first dielectric layer is regarded as a set of dielectric layers because it is not usually made of one single material. However, the invention is not restricted thereto. The combination of the first dielectric layer can be modified according to the semiconductor manufacturing process and the requirements of the sensing chip (e.g., the wear-resisting property of the surface). It is described herein to avoid any confusion. Those skilled in the art should know that FIG. 2 only briefly illustrates the characteristics of the important structure of the invention, and that a complete sensing chip should have associated circuit structures, wherein the associated data may be found in the above-mentioned patent applications.

Because the third dielectric layer (molding compound layer) 30 of the invention needs to cover the wires 35, its basic thickness counted from the surface of the first dielectric layer 24 should be greater than or equal to 50 microns (um), and is equal to about 100 um in a preferred embodiment. Thus, if the capacitance between the first electrode and the second electrode is calculated according to the ordinary molding compound having the dielectric coefficient from 2 to 3, the capacitance falls on about the fF level. This is a significant challenge against the sensitivity of the sensor. Thus, according to the requirement of the invention, the dielectric coefficient of the third dielectric layer 30 must be greater than 5. In one embodiment, the thickness of the third dielectric layer 30 disposed between the first dielectric layer 24 and the second dielectric layer (colorful member) 40 ranges from about 50 microns to 100 microns. This is caused by the height of the wire arc in the wire-bonding process. In order to prevent the sensing capacitance between the second electrode F and the first electrode 22 from being decreased, the dielectric constant of the third dielectric layer 30 in the preferred embodiment is configured to be greater that the dielectric constant of the second dielectric layer (colorful member) 40 or the dielectric constant of the protection layer 24. The material of the high dielectric constant can amplify the capacitance, thereby preventing the sensitivity from being decreased.

It is worth noting, the height greater than or equal to 50 microns has to be left above the bonded wire so that the fillers of the molding compound, each having the diameter of about 20 to 30 um, can enter the space under the bonded wire upon molding to protect the wire from being exposed. However, the third dielectric layer of the invention must be as thin as possible. So, in another embodiment, a mold (not shown) may be designed such that the mold just presses the wires or is slightly higher than the wires by less than 30 microns to decrease 30 to 50% of the height of the third dielectric layer 30, and this represents that the sense capacitance is increased by 30 to 50%. Thus, in FIG. 2, the shortest distance H from the second dielectric layer 40 to the wire 35 electrically connecting the sensing chip 20 to the coupling substrate 10 ranges from 0 to 100 microns.

On the other hand, the above-mentioned embodiment achieves the electrical connection between the sensing chip and the coupling substrate by way of wire bonding so that the second dielectric layer 40 covers over the sensing chip. However, the invention is not restricted thereto and is also applicable to the electrical connection between the sensing chip and the coupling substrate by way of through-silicon via (TSV) or other technology. In this case, the third dielectric layer 30 may be omitted, and the second dielectric layer 40 can directly cover over the first dielectric layer of the sensing chip. Thus, the all-flat sensor 1 of the invention comprises: the coupling substrate 10; the sensing chip 20, which is disposed on the coupling substrate 10, has the first electrodes 22 arranged in an array, and the first dielectric layer 24 covering over the first electrodes 22, and is electrically connected to the coupling substrate 10; and the second dielectric layer 40 covering over the sensing chip and providing the outlook color. In addition, the all-flat sensor 1 may further comprise the third dielectric layer 30, which is disposed between the first dielectric layer 24 and the second dielectric layer 40 and covers over the sensing chip 20 and the coupling substrate 10, wherein the second dielectric layer 40 covers over the third dielectric layer 30 and shades an outlook color of the third dielectric layer 30. When the all-flat sensor is used, the second dielectric layer of the all-flat sensor 1 is in direct or indirect contact with the second electrode, so that a capacitance or an electric field is formed between the second electrode and the first electrode. In addition, although the sensor is the fingerprint sensor described as an example, the sensor of the invention is also applicable to the sensing of the morphology characteristics on the surface of the object.

Figure 3:
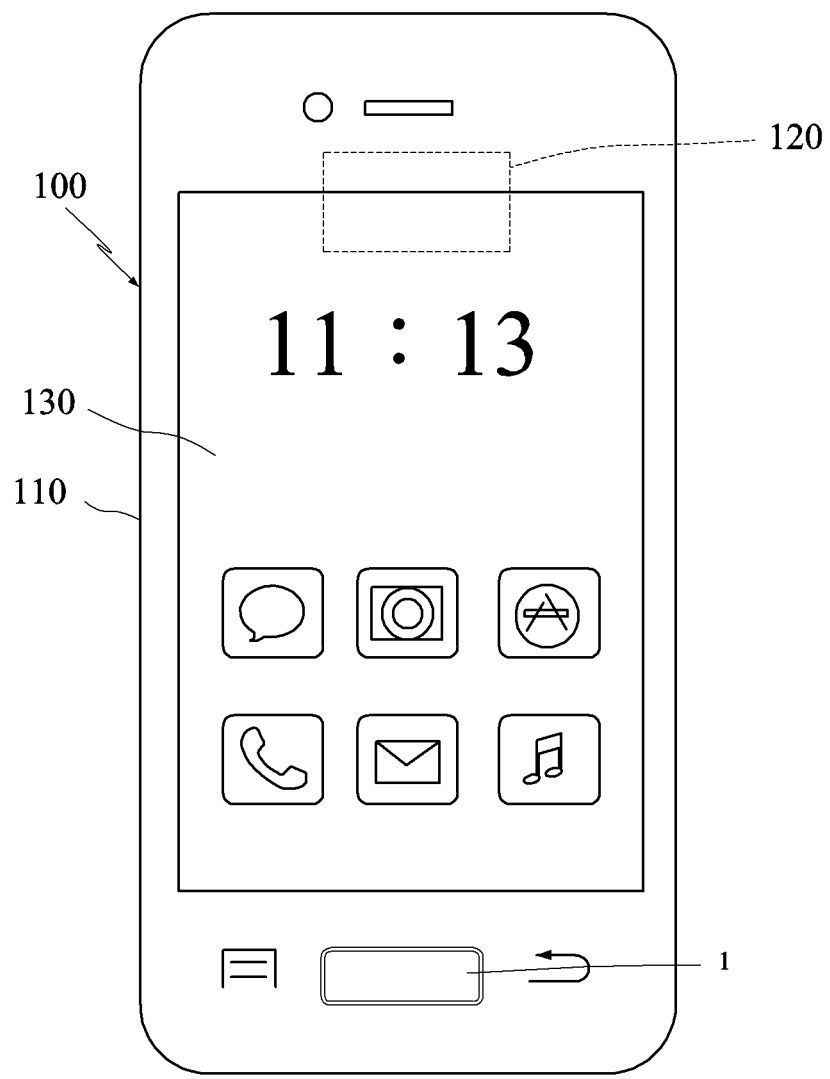
FIG. 3 is a schematic view showing an electronic device according to the first embodiment of the invention.

FIG. 3 is a schematic view showing an electronic device according to the first embodiment of the invention. Referring to FIG. 3, an electronic device 100 of this embodiment comprises a body 110, a central processing unit (CPU) 120, a display 130 and the above-mentioned all-flat sensor 1. The CPU 120 is disposed in the body 110. The display 130 is disposed on the body 110 and electrically connected to the CPU 120. The all-flat sensor 1 is disposed on the body 110. The sensing chip of the invention needs an exposed surface to contact the finger. In order to achieve the overall outlook and color design of the electronic device, the sensor of the first embodiment needs the all-flat surface design and the outlook color to be changeable, so that the outlook and color design of the electronic device can be consistence with the outlook and color design of the sensor. This is also a key issue of this invention to provide the sensor device having the outlook color consistent with that of the electronic device.

Thus, in the sensor of the invention, a second dielectric layer disposed above the third dielectric layer 30 and having the color similar to or the same as that of the outlook color of the electronic device is needed. In another embodiment of the invention, the material of the second dielectric layer 40 is completely the same as that of the colorful member of the electronic device having the outermost surface color, or the colorful member under the transparent glass of the electronic device or another transparent outermost layer, such as transparent sapphire.

The second dielectric layer (colorful member) 40 covers over the third dielectric layer 30. In one embodiment, a dielectric constant of the second dielectric layer/colorful member 40 is smaller than a dielectric constant of the third dielectric layer 30 or a dielectric constant of the first dielectric layer/protection layer 24, and the colorful member 40 shades an outlook color of the third dielectric layer 30, wherein the second dielectric layer (colorful member) 40 may be changed according to the outlook color of the electronic device. The second dielectric layer (colorful member) 40 has the thickness greater than or equal to 1 micron to provide the perfect color shading effect for shading the color of the third dielectric layer, and preferably has the thickness ranging from about 3 microns to 50 microns. In one example, the dielectric constant of the third dielectric layer 30 is greater than the dielectric constant of the protection layer 24.

In this embodiment, the material of the third dielectric layer 30 is selected from the group consisting of one or multiple ones of resin-based and high dielectric coefficient particle fillers, made of aluminum oxide, strontium titanate and barium titanate, for example.

In addition, the sensor 1 of this embodiment may further comprise a driving electrode 50. The driving electrode may be a transparent electrode (made of ITO, for example) or an opaque electrode (made of metal, for example) formed above or on the second dielectric layer, or may be a metallic outer frame, mounted on the lateral side by way of assembling, and is directly or indirectly electrically connected to the sensing chip 20 to output a driving signal coupled to the finger F. In this condition, the all-flat sensor 1 may be referred to as an active sensor. It is worth noting that the driving electrode 50 may also be omitted to form a passive sensor, which can also achieve the sensing effect. These methods can be found in the above-noted patent applications of the present inventor. It is worth noting that the driving electrode 50 can be electrically connected to the sensing chip 20 through the wires penetrating through the third dielectric layer 30 or through the wires electrically connected to the coupling substrate 10. However, the invention is not particularly restricted thereto.

Figure 4:
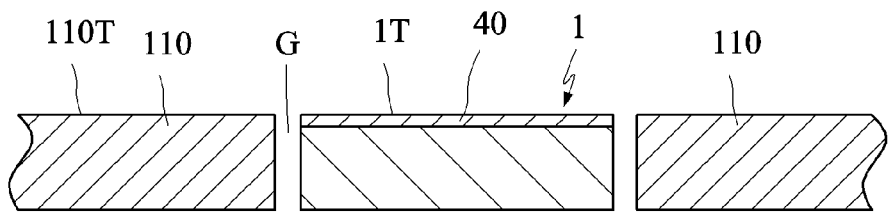
FIGS. 4 to 7 are partial schematic views showing several examples of the electronic device according to the preferred embodiment of the invention.

FIGS. 4 to 7 are partial schematic views showing several examples of the electronic device according to the preferred embodiment of the invention. As shown in FIG. 4, an upper surface 1T of the all-flat sensor 1 and an upper surface 110T of the body 110 are located on the same plane (or located on different planes in another embodiment), wherein the colorful member 40 of the all-flat sensor 1 and the body 110 have the same color. Thus, the electronic device appears to be more beautiful and has the consistent color. In addition, a gap G is formed between the body 110 and the all-flat sensor 1 in this example, so that the all-flat sensor 1 has the function of a push switch. In another example, no gap is formed between the body 110 and the all-flat sensor 1, and the switch function can be provided according to the capacitive touch principle of the all-flat sensor 1.

Figure 5:
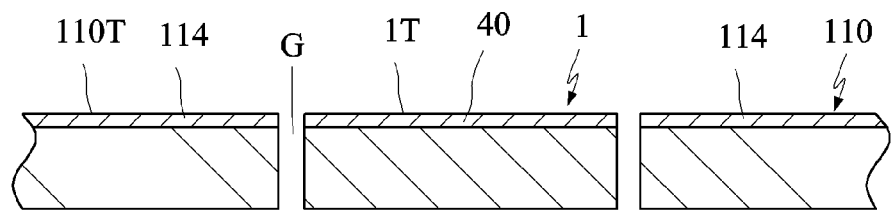

As shown in FIG. 5, this example is similar to FIG. 4 except that the colorful member 40 of the all-flat sensor 1 and a colorful member 114 of the body 110 have the same color.

Figure 6:
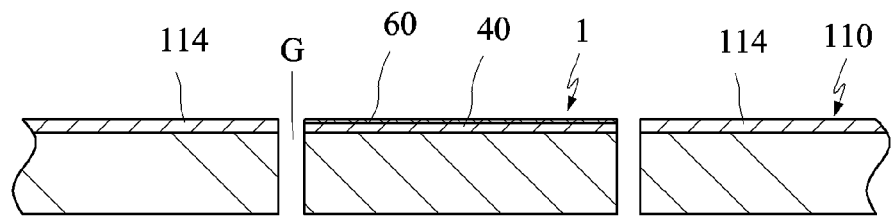

As shown in FIG. 6, this example is similar to FIG. 4 except that the all-flat sensor 1 further comprises a fourth dielectric layer (wear-resisting layer) 60, which is located on the second dielectric layer 40 and directly contacts the finger to resist the wear when contacting with the finger to lengthen the endurability of the sensor. In this example, the material of the wear-resisting layer 60 includes, for example but without limitation to, the epoxy resin, aluminum oxide, strengthened glass, diamond film, diamond-like carbon film, sapphire or the like.

Figure 7:
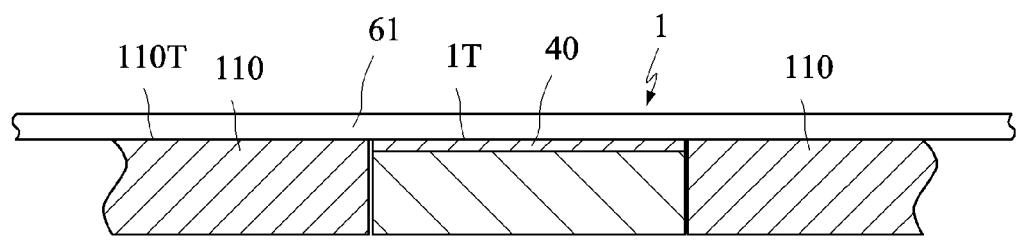

As shown in FIG. 7, this example is similar to FIG. 4 except that the all-flat sensor 1 further comprises a transparent panel 61, which is also a wear-resisting layer/fourth dielectric layer, to be in direct contact with the finger to resist the wear when contacting the finger. Thus, the sensor has the first and second dielectric layers, and is then placed under the transparent panel (e.g., transparent glass) to achieve the completely hidden sensing chip. That is, the second dielectric layer (colorful member) under the transparent glass, the transparent sapphire or another transparent outermost layer of the electronic device shades the outlook color of the sensing module 20M (see FIG. 8). It is worth noting that when the sensor has the fourth dielectric layer (wear-resisting layer), the driving electrode 50 may be disposed on the wear-resisting layer or the side surface. Alternatively, the transparent panel 61 may also be regarded as one portion of the electronic device. Thus, the electronic device 100 may further comprise a transparent panel 61 covering over the body 110 and the all-flat sensor 1.

Figure 8:
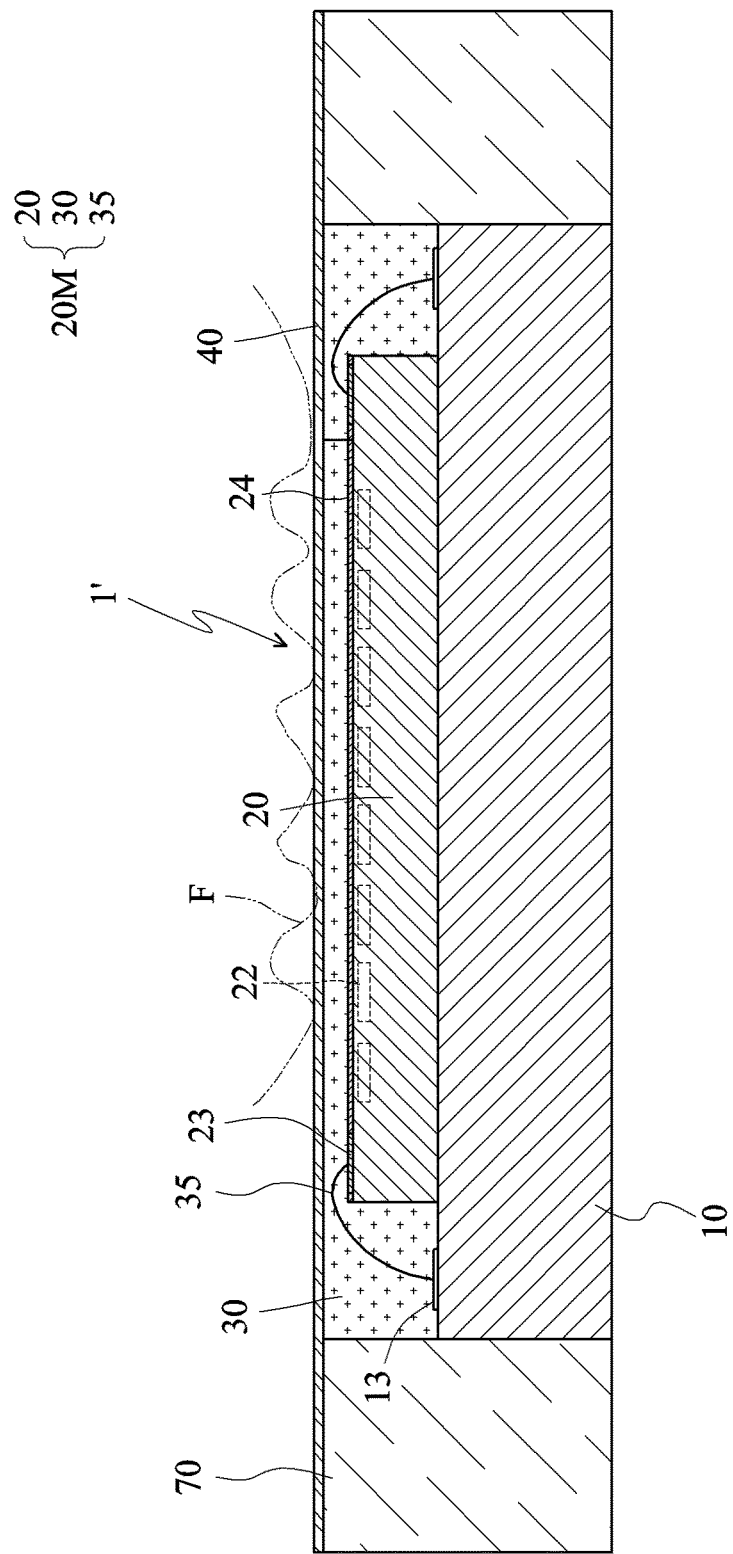
FIG. 8 is a schematic view showing a sensor according to a second embodiment of the invention.
Figure 9:
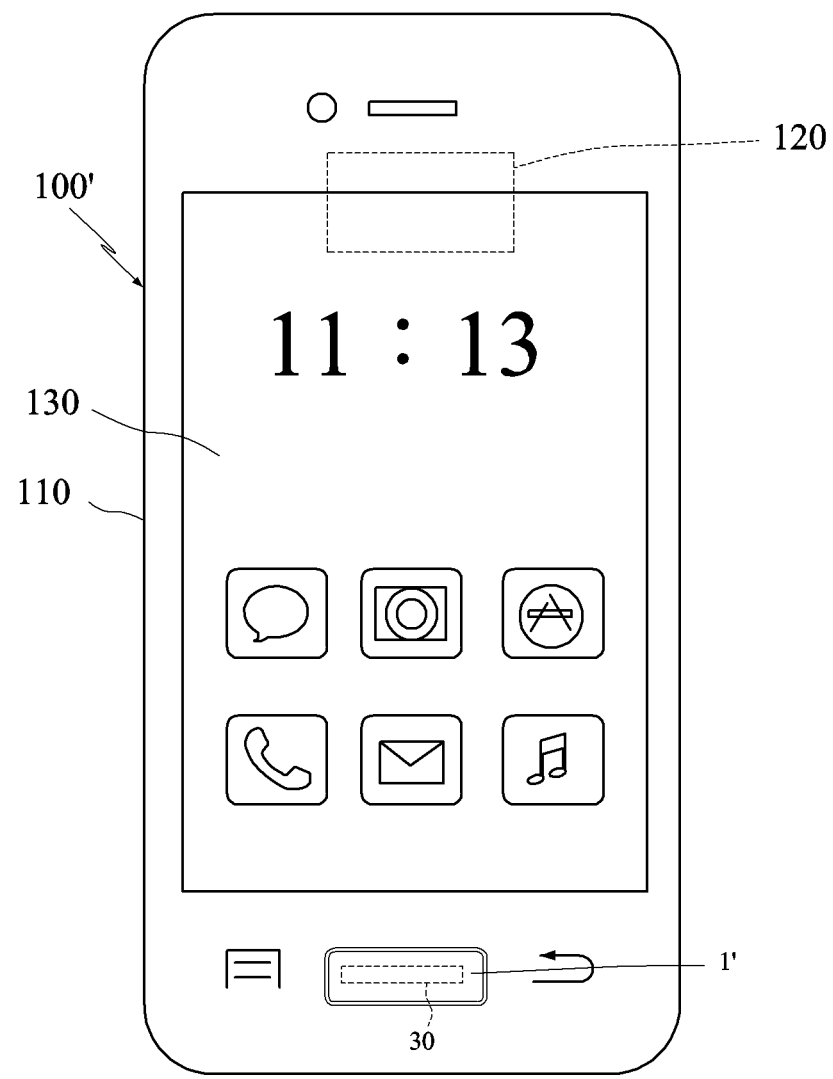
FIG. 9 is a schematic view showing an electronic device according to the second embodiment of the invention.

FIG. 8 is a schematic view showing a sensor 1' according to a second embodiment of the invention. FIG. 9 is a schematic view showing an electronic device 100' according to the second embodiment of the invention. Referring to FIGS. 8 and 9, this embodiment is similar to the first embodiment except that the all-flat sensor 1' of this embodiment comprises a sensing module 20M and a colorful member 40.

The sensing module 20M comprises a sensing chip 20, a third dielectric layer 30 and wires 35. Thus, in brief, the sensing module 20M has first electrodes 22 arranged in an array and a first dielectric layer 24 covering over the first electrodes 22. The second dielectric layer 40 covers over the sensing module 20M and provides an outlook color. In this embodiment, the second dielectric layer (colorful member) 40 shades the outlook color of the sensing module 20M. It is worth noting that the range of the third dielectric layer 30 and its corresponding sensing chip 20 is depicted by the range defined by the dashed lines of FIG. 9, and is smaller than the range of the sensing chip 1 of FIG. 3. Thus, the all-flat sensor 1' further comprises a peripheral holder 70 supporting and surrounding the periphery of the sensing module 20M to provide the final dimension of a button or key, for example. In addition, the material of the holder 70 may also be the same as that of the third dielectric layer, or the holder 70 may be formed by a mold and then combined with the sensing module by way of assembling. In addition, the second dielectric layer (colorful member) 40 is formed to further cover over the holder 70 and shade an outlook color of the holder 70. The advantage of this embodiment is that the sensing chip 20 needs not to be manufactured to be too large, and the holder 70 can be utilized to form the chamfers, smooth structures or various models of the all-flat sensor 1'. Meanwhile, it is to be specified that the bottom portion of the holder 70 is unnecessary to be flush with the bottom portion of the coupling substrate, as shown in FIG. 8, and variations may be made according to the manufacturing and assembling convenience and firmness. The key issue resides in that the surfaces of the colorful member and the holder to be in contact with the finger must be disposed on the same plane, and that the all-flat sensor 1' has an integral outlook after the colorful member is formed.

It is worth noting that although the embodiments are described with reference to the sensor with the wires 35 and the third dielectric layer 30, the invention is not restricted thereto. It is also possible to adopt the all-flat sensor, which has no wire 35 and no third dielectric layer 30 and can adopt the through silicon via (TSV) or other techniques to achieve the requirements of the electrical connection and the package so that the effect of the invention can be achieved. Thus, the sensing module 20M only needs to have multiple sensing member electrodes 22 arranged in an array and the protection layer 24 covering over the sensing member electrodes 22.

Figure 10:
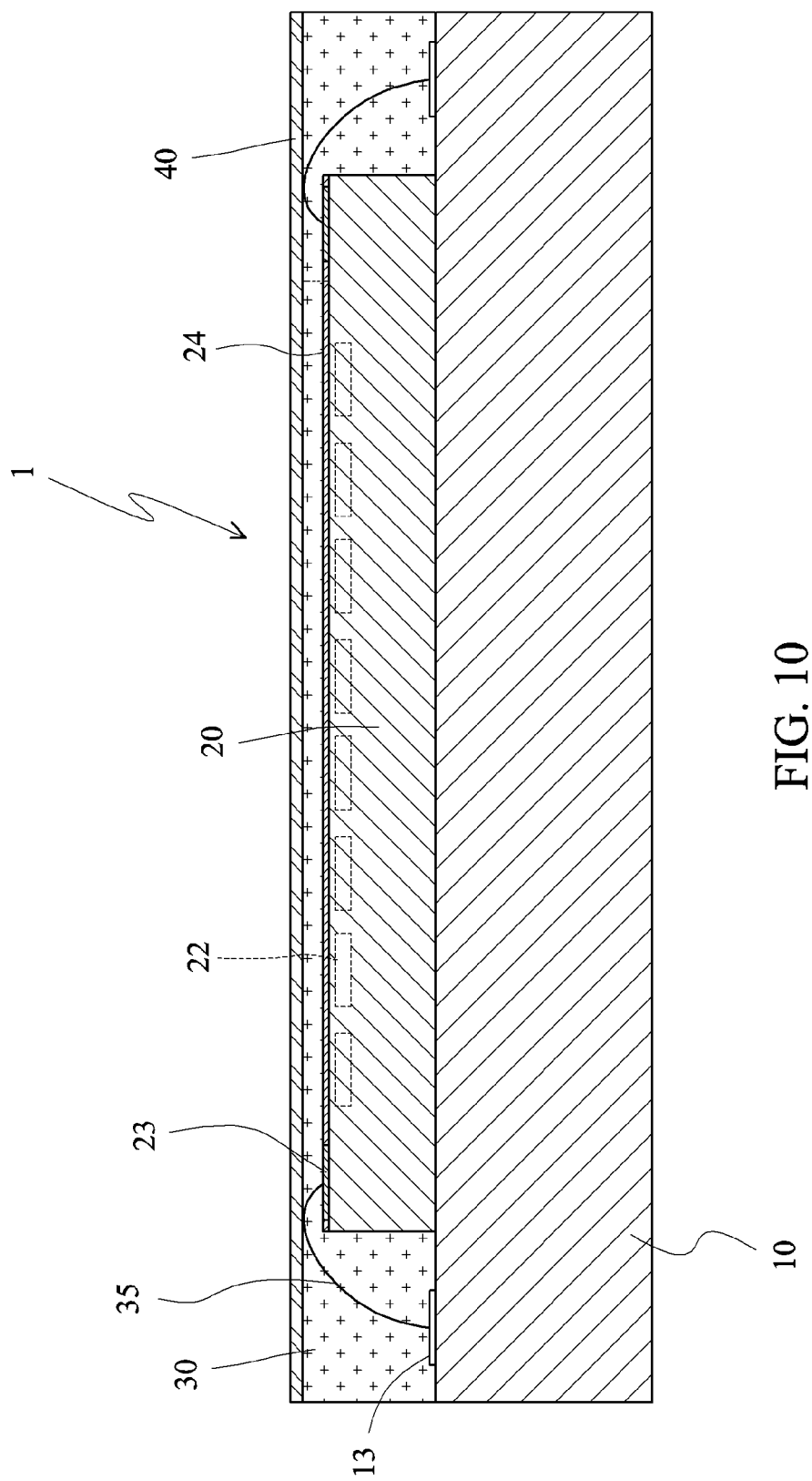
FIG. 10 is a schematic view showing a sensor according to a third embodiment of the invention.

FIG. 10 is a schematic view showing a sensor according to a third embodiment of the invention. As shown in FIG. 10, this embodiment is similar to the first embodiment except that the shortest distance H between the wire 35 and the second dielectric layer 40 is 0. That is, the mold directly contacts the wire 35 so that the wire 35 directly contacts the second dielectric layer 40. This is completely different from the conventional wire-bonding technique. Because the subsequently formed second dielectric layer covers over the wires to protect the wires, this embodiment can be implemented so that the second dielectric layer concurrently provides the function of providing the outlook color and protecting the wires.

With the embodiments of the invention, the outlook colors of the electronic device and the sensor can be matched, and it is also possible to achieve the effect of glorifying the outlook without decreasing the sensitivity.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. An all-flat sensor, comprising:
a sensing module comprising a sensing chip and a coupling substrate, wherein the sensing module has first electrodes arranged in an array, and a first dielectric layer covering over the first electrodes;
a second dielectric layer covering over the sensing module and providing an outlook color; and
a third dielectric layer, disposed between the first dielectric layer and the second dielectric layer and covering over the sensing chip and the coupling substrate, wherein the second dielectric layer covers over the third dielectric layer and shades an outlook color of the third dielectric layer, wherein a thickness of the third dielectric layer disposed between the first dielectric layer and the second dielectric layer ranges from 50 microns to 100 microns.

2. The all-flat sensor according to claim 1, wherein the second dielectric layer shades an outlook color of the sensing module.

3. The all-flat sensor according to claim 1, further comprising a third dielectric layer disposed between the first dielectric layer and the second dielectric layer, wherein the second dielectric layer covers over the third dielectric layer and shades an outlook color of the third dielectric layer.

4. The all-flat sensor according to claim 1, wherein when the all-flat sensor is used, the second dielectric layer of the all-flat sensor contacts a second electrode, so that a capacitance or an electric field is formed between the second electrode and the first electrode.

5. The all-flat sensor according to claim 4, further comprising:
a wear-resisting layer, which is disposed on the second dielectric layer and directly contacts the second electrode to resist wear upon contacting.

6. The all-flat sensor according to claim 4, wherein the all-flat sensor is a fingerprint sensor, and the second electrode is a finger.

7. The all-flat sensor according to claim 1, further comprising:
a holder supporting and surrounding a periphery of the sensing module, wherein the second dielectric layer further covers over the holder and shades an outlook color of the holder.

8. An electronic device, comprising: a body; a central processing unit (CPU) disposed in the body; a display disposed on the body and electrically connected to the CPU; and the all-flat sensor according to claim 1, wherein the all-flat sensor is disposed on the body, so that an upper surface of the all-flat sensor and an upper surface of the body are located on the same plane, wherein the second dielectric layer of the all-flat sensor and the body have the same color.

9. The electronic device according to claim 8, wherein a gap is formed between the body and the all-flat sensor.

10. The electronic device according to claim 8, further comprising a transparent panel covering over the body and the all-flat sensor.

11. An electronic device, comprising: a body; a central processing unit (CPU) disposed in the body; a display disposed on the body and electrically connected to the CPU; and the all-flat sensor according to claim 1, wherein the all-flat sensor is disposed on the body, so that an upper surface of the all-flat sensor and an upper surface of the body are located on the same plane, wherein the second dielectric layer of the all-flat sensor and a colorful member of the body have the same color.

12. The electronic device according to claim 11, wherein a gap is formed between the body and the all-flat sensor.

13. The electronic device according to claim 11, further comprising a transparent panel covering over the body and the all-flat sensor.

14. An all-flat sensor, comprising:
a coupling substrate:
a sensing chip, which is disposed on the coupling substrate, has first electrodes arranged in an array and a first dielectric layer covering over the first electrodes, and is electrically connected to the coupling substrate; and
a second dielectric layer covering over the sensing chip and providing an outlook color;
wires electrically connecting the sensing chip to the coupling substrate, wherein a shortest distance between the wire and the second dielectric layer ranges from 0 to 100 microns.

15. The all-flat sensor according to claim 14, wherein when the all-flat sensor is used, the second dielectric layer of the all-flat sensor contacts a second electrode, so that a capacitance or an electric field is formed between the second electrode and the first electrode.

16. The all-flat sensor according to claim 15, further comprising:
a driving electrode, which is electrically connected to the sensing chip and outputs a driving signal coupled to the second electrode.

17. The all-flat sensor according to claim 15, further comprising:
a wear-resisting layer, which is disposed on the second dielectric layer and directly contacts the second electrode to resist wear upon contacting.

18. The all-flat sensor according to claim 15, wherein the all-flat sensor is a fingerprint sensor, and the second electrode is a finger.

19. The all-flat sensor according to claim 14, wherein a thickness of the second dielectric layer ranges from 1 micron to 50 microns.

20. The all-flat sensor according to claim 14, wherein a dielectric constant of the second dielectric layer is smaller than a dielectric constant of the third dielectric layer or a dielectric constant of the first dielectric layer.

* * * * *